(12) United States Patent
Ochs et al.

(10) Patent No.: US 7,772,688 B2
(45) Date of Patent: Aug. 10, 2010

(54) ELECTRONIC CIRCUIT UNIT

(75) Inventors: Eric Ochs, Tübingen (DE); Christoph Ruf, Eningen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 11/631,559

(22) PCT Filed: Jun. 30, 2005

(86) PCT No.: PCT/EP2005/053091

§ 371 (c)(1),
(2), (4) Date: Nov. 16, 2007

(87) PCT Pub. No.: WO2006/003170

PCT Pub. Date: Jan. 12, 2006

(65) Prior Publication Data

US 2008/0061426 A1    Mar. 13, 2008

(30) Foreign Application Priority Data

Jun. 30, 2004    (DE) .................. 10 2004 032 371

(51) Int. Cl.
*H01L 23/04* (2006.01)
(52) U.S. Cl. .................. 257/699; 257/706; 257/707
(58) Field of Classification Search .................. 257/699, 257/706, 707
See application file for complete search history.

(56) References Cited

U.S. PATENT DOCUMENTS

| | | | |
|---|---|---|---|
| 4,823,235 A | | 4/1989 | Suzuki et al. |
| 5,426,405 A | * | 6/1995 | Miller et al. ................ 333/247 |

FOREIGN PATENT DOCUMENTS

| | | |
|---|---|---|
| DE | 10031678 | 7/2001 |
| EP | 1006766 | 6/2000 |
| EP | 1 126 565 | 8/2001 |
| GB | 2280790 | 8/1995 |
| JP | 11-195731 | 7/1999 |
| JP | 2002076259 | 3/2002 |
| JP | 2004-022844 | 1/2004 |
| JP | 2004153034 | 5/2004 |
| WO | WO 97/15078 | 4/1997 |

* cited by examiner

*Primary Examiner*—Phat X Cao
(74) *Attorney, Agent, or Firm*—Kenyon & Kenyon LLP

(57) ABSTRACT

The present invention relates to an electronic circuit unit having at least one semiconductor (15), that is situated on a substrate, and whose electrical connections are in electrical contact with printed circuit traces of the substrate, and having a housing, that accommodates the substrate, which has contact paths which are connected to the printed circuit traces of the substrate using electrical connections. It is provided that the electrical connections (20) each have a contact surface (17) situated on the substrate (12) which, when the substrate (12) and the housing (2) are joined together, comes to lie in an opposing position to the counter-contact surfaces (19) of the contact paths (21). The present invention also relates to a corresponding manufacturing method.

19 Claims, 1 Drawing Sheet

ELECTRONIC CIRCUIT UNIT

The present invention relates to an electronic circuit unit according to the generic part of claim 1. Furthermore, the present invention relates to a corresponding method.

BACKGROUND INFORMATION

Electronic circuits are used in practically all areas of daily life. In particular, electronic circuits are used for control and/or regulation purposes in the most varied fields and for the most different requirements In the automotive industry, electronic circuits are used especially for control and/or regulation purposes. Here, they are preferably configured as electronic circuit units, which provide at least one semiconductor and corresponding devices in a specific housing in order to produce a connection of the electronic circuit unit to the other electrical or electronic circuits of the vehicle. In most instances, the semiconductors are bonded or soldered to a substrate patterned in an application-specific manner together with a few passive components. Suitable ceramics, for example, are used as substrate. The heat losses produced during operation of the electronic circuit, in particular in electronic control devices having increased power loss, are dissipated via an application-specific heat sink. Together with the application-specific housing, the substrate forms a module with the semiconductor and the heat sink mounted on it, contact path-forming printed conductors and connected with these, outlying plug pins being provided for the external contacting of the circuit unit. The electrical contacting of the substrate with the contact paths or the plug pins of the housing is implemented via heavy wire bonding connections; due to the high currents, a plurality of bonding connections having to be implemented in parallel.

This has the disadvantage that relatively much space is required within the housing due to the set-up of the heat sink and the electrical contacting via heavy wire bonding connections (in particular in the case of multiple parallel bonding connections), or that the housing must have relatively large dimensions. Furthermore, it is disadvantageous that the heavy wire bonding connections must be applied sequentially, necessitating a costly manufacturing process, which additionally requires a relatively long time.

SUMMARY OF THE INVENTION

In contrast to this, the present invention offers the advantage that, in an electronic circuit unit having at least one semiconductor disposed on a substrate and whose electrical connections are in electrical contact with printed circuit traces of the substrate, and having a housing that accommodates the substrate which has contact paths that are connected to the printed circuit traces of the substrate via electrical connections, it is provided that each of the electrical connections has a contact surface disposed on the substrate, and these come to be situated opposite mating contact surfaces of the contact paths for contacting, when substrate and housing are joined together. In contrast to the specific embodiments from the related art, it is therefore provided that, during joining of the components of substrate (including semiconductors applied on it) and housing (including contact paths situated therein and leading to the external contact devices), contact surfaces on the substrate come to be situated across from contact decks on the housing leading to the external contact devices.

The opposing positioning effects an electrical contact layout.

According to an additional specific embodiment of the present invention, it is provided that an electrically conductive bonding agent is situated between contact surfaces and mating contact surfaces. This makes it possible to simultaneously produce a very satisfactory contact between contact surfaces and counter-contact surfaces, and to provide a mechanically stable connection between the housing and the substrate supporting the semiconductor as well.

According to another specific embodiment of the present invention, it is provided that a solder connection is disposed between the contact surfaces and the counter-contact surfaces.

In a further development of the present invention, the circuit traces are disposed on the one side of the substrate and the contact surfaces on the other side of the substrate, the circuit traces and the contact surfaces being connected with the aid of plated-through holes. This setup is selected especially whenever the semiconductor is also situated on the side of the substrate lying opposite the contact surfaces. Due to the fact that the printed circuit traces are disposed on the side of the substrate that carries the semiconductor, a simple application (in particular, a simple soldering) and thus an easy contacting as well as the mechanical fixing in place of the semiconductor on the printed circuit traces is possible. As a result of the plated-through hole of the printed circuit traces to the opposite side of the substrate and the setup of the contact surfaces there, a very compact design and a configuration that is easy to manipulate when assembling and also when installing is produced. In particular, it is thereby easily possible to introduce the substrate having the semiconductor placed on it (as a module, so to speak) into a housing that is formed like a half shell, which has the counter-contact surfaces and the contact paths.

According to a further development of the present invention, it is provided that the semiconductor is a power semiconductor.

According to another refinement of the present invention, the substrate is developed as a heat-conductive substrate. Especially when power semiconductors are used, the heat loss created can in this way also be very easily dissipated via the substrate. Thus, heat accumulation is avoided to the greatest extent.

According to an additional further development of the present invention, a heat sink is assigned to the semiconductor which is used for the dissipation of the heat loss.

Still another refinement of the present invention provides that the heat sink is located on the side opposite the semiconductor of the substrate, and the heat sink is connected to the substrate in a heat-conductive manner. In particular, in connection with the above-mentioned design of the substrate as a heat-conductive substrate, not only is it possible, in this way, to effect a simplified construction, but also a very good dissipation of heat.

According to one preferred refinement of the present invention, it is provided that the heat sink is integrated into the housing, in particular, molded into the housing. Accordingly, the heat sink is an integral component of the housing which, because of the simple joining together, described above, of the housing and the substrate carrying the semiconductor is also linked to the semiconductor mechanically and thermally.

According to one additional preferred specific embodiment of the present invention, it is provided that the contact paths be integrated, especially molded into the housing, particularly a plastic housing. In this manner, one is able to manage the electrical contacting to the outside without additional components, and without special processing steps required during assembly.

According to an additional refinement of the present invention, it is provided that a heat conducting layer be situated between the heat sink and the semiconductor and/or between the heat sink and the substrate. This may be made up, for example, of a heat conducting paste or a similar material, and it is used for the reliable and uniform dissipation of the heat loss that is created in the semiconductor.

The present invention also relates to a method for producing an electronic circuit unit having at least one semiconductor disposed on a substrate, and whose electrical connections are in electrical contact to printed circuit traces of the substrate, and having a housing that accommodates the substrate which has contact paths that are connected to the printed circuit traces of the substrate using the electrical connections. In this instance, it is provided that, when the substrate and the housing are joined together to produce the electrical connection, in each case a contact surface situated on the substrate is placed into an opposite position to a corresponding counter-contact surface of the contact path.

According to one refinement of the method, it is provided that, in order to produce an above-described electronic circuit unit, in which the electrical connections include in each case a contact surface situated on the substrate and a corresponding counter-contact surface of the contact path, the contact surfaces and the counter-contact surfaces get to lie against one another because of the joining together of substrate and housing, and thereby come into electrical contact. Consequently, by assembling the substrate that carries the semiconductor and the housing, each electrical connection is produced that the circuit device has. Accordingly, the production of the electrical connections takes place both simultaneously to one another as well as simultaneously to the assembly of housing and substrate. This brings about a substantial time saving, because of being able to omit bonding connections that have to be sequentially applied, because of the simplification of the apparatus expenditure required for the production, and thus brings about a clear cost reduction in manufacturing.

According to one preferred refinement of the method, it is provided, in joining together the substrate and the housing, thereby in one action producing the electrical connections, that one should also effect a thermal contacting of the semiconductor, if necessary via the also thermally conductive substrate, to a heat sink situated in or on the housing, for example, molded in. Accordingly, both the electrical and the thermal connection are produced in a single working step, which again causes a simplification in the production and a cost reduction.

According to still another refinement of the method, it is provided that an electrically conductive adhesive is used for joining together the substrate and the housing. Such an adhesive is easy to apply, for instance, it may be printed on, and, during the joining together, it has the effect of both mechanically fixing the substrate in the housing and of making the electrical connection between the contact surfaces and the counter-contact surfaces. Because of its electrical conductivity, the adhesive replaces soldering points between the contact surfaces and the counter-contact surfaces of the electrical connection.

According to one particularly preferred refinement of the method, an adhesive is used for the joining together, which is conductive both electrically and thermally. Therefore, the adhesive is able to be used in one action both at the electrical connections and for producing the thermal connection between the substrate/semiconductor and the heat sink, in particular, it may be applied in one action, such as being printed on. The thermal, the electrical and the mechanical connection are thus effected in one single production step.

In the following, the present invention is described in more detail on the basis of a drawing and an exemplary embodiment.

DETAILED DESCRIPTION OF THE INVENTION

Figure 1:
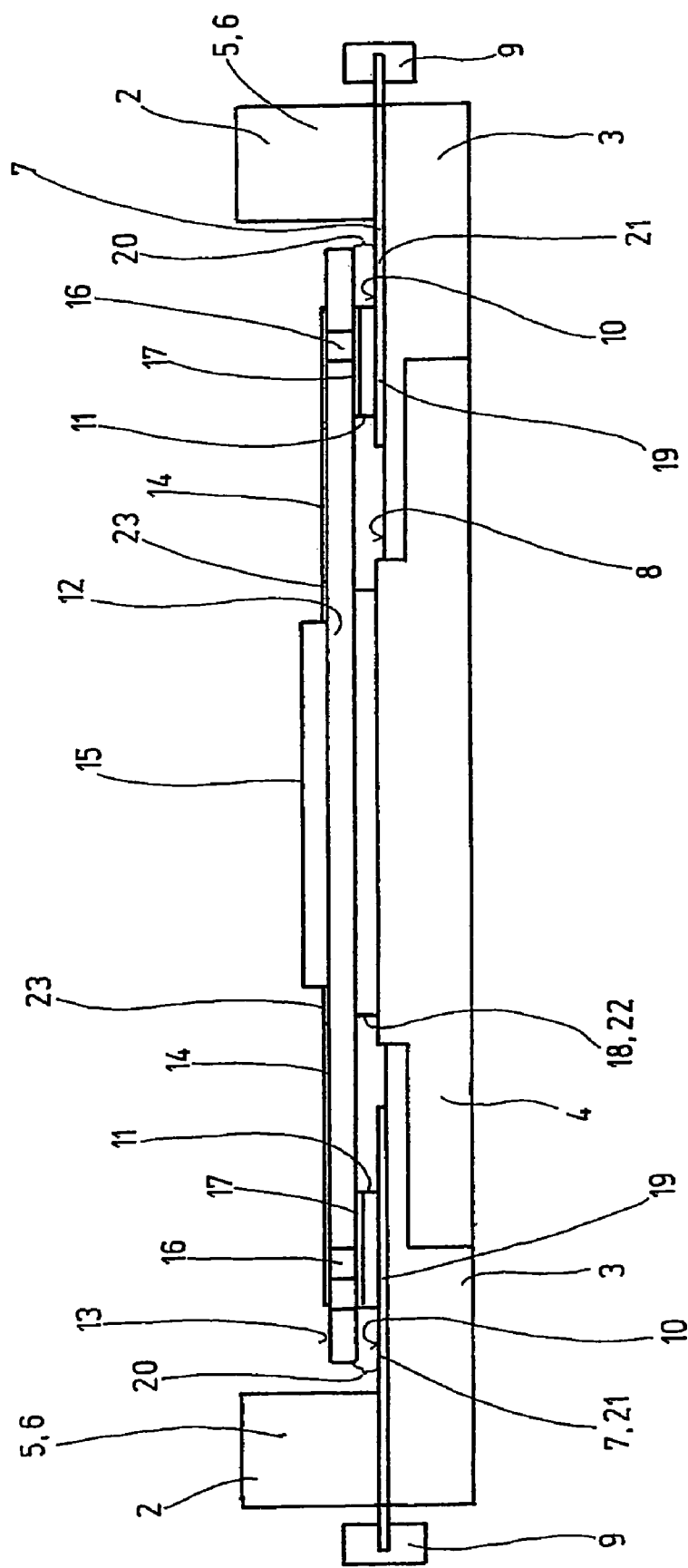
FIG. 1 shows a schematic cross section through an electronic circuit unit.

FIG. 1 shows a cross section through an electronic circuit unit 1 [1] in a schematic representation. A housing 2, shown only partially, has a bottom section 3, into which a heat sink 4 has been inserted, for instance, molded in. Side sections 5 are set on bottom section 3, which form sidewalls 6 of housing 2. Bottom section 3 has an inner surface 8 on which printed circuit traces 7 are situated which form contact paths 21. Contact paths 21 sectionally extend through sidewalls 6 of housing 2 and end up in contact pieces 9, shown only schematically, which lie outside housing 2, and by which the outside contacting of electronic circuit unit 1 is effected. Contact paths 21 have a printed circuit trace upper side 10. Inside housing 2, a substrate 12 is situated, spatially above contact paths 21. Substrate 12 has a substrate upper side 13, on which printed circuit traces 14 are situated that are assigned to a semiconductor 15 that is situated on substrate 12, and via whose electrical connections 23 effect their contacting. Printed circuit traces 14 are connected in an electrically conductive manner to contact surfaces 17 via plated-through holes 16, which are on the side of the substrate which is opposite to semiconductor 15 and printed circuit traces 14, that is, they are assigned to contact paths 21 that are located on the housing. The sections of contact paths 21 that lie exactly across from contact surfaces 17 form counter-contact surfaces 19. Between contact surfaces 17 and counter-contact surfaces 19 a solder point is applied in each case, which produces the electrical connection between contact surfaces 17 and counter-contact surfaces 19. Alternatively, one may use an electrically conductive adhesive. The electrical signal line, or rather, the contacting of semiconductor 15 to contact pieces 9 that lie outside the housing, and thus to an additional wiring within which electronic circuit unit 1 is set, thus runs starting from semiconductor 15, via its electrical contacts 23, printed circuit traces 14, through-hole plating 16 and contact surfaces 17, which are in electrical contact with counter-contact surfaces 19 via solder points 11, counter-contact surfaces 19 being able to be designed as parts of contact paths 21 or, alternatively, as sections connected to printed circuit traces 7/contact paths 21 in an electrically conductive manner. Via solder points 11 (or an electrically conductive adhesive) and counter-contact surfaces 19, contact surfaces 17 form an electrical connection 20 between semiconductor 15 situated on substrate 12 and contact paths 21 that are situated on housing 2. Because of the comparatively large surface design of contact surfaces 17 and counter-contact surfaces 19, there comes about a high current-carrying capability. Furthermore, because of the planar specific embodiment having one item situated vertically above another, and the connection of printed circuit traces 14, that is assigned to semiconductor 15, to contact surfaces 17 via through-hole plating 16, an electrical connection is implemented that is greatly space saving and is simple to manufacture. It is especially advantageous that contact surfaces 17 are able to be connected simultaneously, that is, simultaneously in the manufacturing process (namely by soldering) to counter-contact surfaces 19 via solder points 11, and that, in addition, in the process, simultaneously the mechanical fixing of substrate 12 having semiconductor 15, that is located on top of it, to heat sink 4, or a heat conducting layer 18 that is situated between heat sink 4 and substrate 12, takes place. Alternatively to the soldering using solder points 11, it is provided to use an electrically conductive adhesive between contact surfaces 17 and counter-contact surfaces 19. A high current carrying capability of the connection is connected, in this instance, with a greatly space saving design and a manufacturing process that is very simple and requires only a few operational steps of very short time duration.

What is claimed is:

1. An electronic circuit unit, comprising:
    at least one semiconductor device disposed on a substrate and including electrical connections in electrical contact to printed circuit traces of the substrate; and
    a housing that accommodates the substrate and has substantially planar contact paths formed integrally with a body of the housing, the contact paths being connected to the printed circuit traces of the substrate using electrical connections, wherein the electrical connections have a contact surface situated on the, substrate which, when the substrate and the housing are joined together, comes to lie in an opposing position to counter-contact surfaces of the contact paths to facilitate electrical contact between the printed circuit traces and the contact paths, and wherein the contact paths extend through a body of the housing to connect to respective external contacts.

2. The circuit unit as recited in claim 1, wherein the opposing position of the contact surfaces and the counter-contact surface effects an electrical contact layout.

3. The circuit unit as recited in claim 1, wherein an electrically conductive adhesive is situated in each case between the contact surfaces and the counter-contact surfaces.

4. The circuit unit as recited in claim 1, wherein a soldering connection is situated in each case between the contact surfaces and the counter-contact surfaces.

5. The circuit unit as recited in claim 1, wherein the printed circuit traces are located on one side of the substrate and the contact surfaces are located on the other side of the substrate, the printed circuit traces and the contact surfaces being electrically connected with the aid of through-hole plating.

6. The circuit unit as recited in claim 1, wherein the semiconductor device is a power semiconductor.

7. The circuit unit as recited in claim 1, wherein the substrate is developed as a heat conductive substrate.

8. The circuit unit as recited in claim 1, wherein a heat sink is assigned to the semiconductor device.

9. The circuit unit as recited in claim 1, wherein the heat sink is located on the opposite side of the substrate from the semiconductor device, and the heat sink is connected to the substrate in a heat conductive manner.

10. The circuit unit as recited in claim 1, wherein the heat sink is integrated into the housing, especially molded into the housing.

11. The circuit unit as recited in claim 1, wherein the contact paths are integrated, especially molded into the housing, especially a plastic housing.

12. The circuit unit as recited in claim 1, wherein a heat conducting layer is situated between the heat sink and the semiconductor device, or between the heat sink and the substrate.

13. The circuit unit as recited in claim 1, wherein one of a solder connection and an electrically conductive adhesive joins the contact surfaces to the opposing counter-contact surfaces.

14. The circuit unit as recited in claim 9, wherein the contact surfaces and the counter-contact surfaces are adapted to be joined simultaneously with a connecting of the substrate to the heat sink, and wherein the heat sink, the substrate, the contact surfaces and the countercontact surfaces are each adapted to receive a thermally and electrically conductive adhesive to facilitate the simultaneous joining.

15. A method for producing an electronic circuit unit having at least one semiconductor device that is situated on a substrate, and whose electrical connections are in electrical contact with printed circuit traces of the substrate, and having a housing that accommodates the substrate, the housing having substantially planar contact paths that are formed integrally with a body of the housing and are connected to the printed circuit traces of the substrate using electrical connections which each include a contact surface situated on the substrate and a corresponding counter-contact surface of the contact path, comprising:
    joining the substrate and the housing together such that the contact surfaces and the counter-contact surfaces lie in opposing positions to each other to facilitate electrical contact between the printed circuit traces and the contact paths; and
    electrically connecting the contact surfaces to the opposing counter-contact surfaces, wherein the contact paths extend through a body of, the housing to connect to respective external contacts.

16. The method as recited in claim 15, further comprising:
    joining the substrate and the housing together such that the semiconductor device makes thermally conductive contact with a heat sink that is situated on the housing.

17. The method as recited in claim 15, further comprising:
    joining the contact surfaces to the opposing counter-contact surfaces using one of a solder connection and an electrically conductive adhesive.

18. The method as recited in claim 17, wherein the electrically conductive adhesive is thermally conductive.

19. The method as recited in claim 16, wherein the contact surfaces and the counter-contact surfaces are joined simultaneously with a connecting of the substrate to the heat sink, an electrially and thermally conducting adhesive being applied to facilitate joining between the contact surfaces and the counter-contact surfaces and between the substrate and the heat sink.

\* \* \* \* \*